United States Patent [19]

Ericsson

[11] Patent Number: 4,903,595
[45] Date of Patent: Feb. 27, 1990

[54] ARRANGEMENT FOR PRODUCING A PLURALITY OF PRINTING FORMS AUTOMATICALLY AND IN SEQUENCE

[76] Inventor: Sylve J. D. Ericsson, Golléns väg 8, 147 00 Tumba, Sweden

[21] Appl. No.: 234,958
[22] Filed: Aug. 22, 1988

[30] Foreign Application Priority Data

Aug. 27, 1987 [SE] Sweden .............................. 8703314

[51] Int. Cl.⁴ .............................................. B41C 1/14
[52] U.S. Cl. .................................................. 101/128.4
[58] Field of Search ....................... 101/128.4, 128.21; 430/308

[56] References Cited

U.S. PATENT DOCUMENTS

| | | | |
|---|---|---|---|
| 3,329,796 | 7/1967 | Manwaring | 219/10.55 |
| 4,214,522 | 7/1980 | Bille | 101/128.4 |
| 4,221,165 | 9/1980 | Ericsson | 101/126 |
| 4,516,495 | 5/1985 | Ericsson | 101/129 |
| 4,589,335 | 5/1986 | Svantesson | 101/114 |
| 4,610,200 | 9/1986 | Metso | 101/126 |
| 4,669,377 | 6/1987 | Ericsson et al. | 101/114 |

FOREIGN PATENT DOCUMENTS 2045728A 11/1980 United Kingdom ................ 101/126

*Primary Examiner*—Clifford D. Crowder
*Attorney, Agent, or Firm*—Burns, Doane, Swecker & Mathis

[57] ABSTRACT

Printing forms are produced by arranging in a magazine a plurality of printing frames, each including a stretch cloth and a light-sensitive coating. The printing frames are arranged in parallel relationship and parallel to an outlet slit of the magazine. The frames are advanced within the magazine toward the outlet slit in a first direction. The printing frames are sequentially passed through the outlet slit in a second direction disposed substantially perpendicular to the first direction. The frames pass through the slit while remaining parallel to printing frames disposed in the magazine. Movement of each printing frame traveling in the second direction is terminated when the printing frame occupies a position in front of an imaging apparatus. The imaging apparatus is actuated to expose the light sensitive coating to an image corresponding to a desired printing pattern. Movement of the printing frame with the exposed light-sensitive coating is initiated to move the printing frame out of the exposing station and into a developing station where the printing pattern is developed.

7 Claims, 1 Drawing Sheet

ARRANGEMENT FOR PRODUCING A PLURALITY OF PRINTING FORMS AUTOMATICALLY AND IN SEQUENCE

TECHNICAL FIELD

The present invention relates to an arrangement for producing a plurality of printing forms automatically and in sequence, and more particularly, although not exclusively, printing forms which are intended for use in silk screen printing processes carried out in silk screen printers.

According to the present invention, each printing form is produced by applying a light-sensitive coating to a cloth stretched in a flexurally rigid frame, exposing an image corresponding to the desired printing pattern to the light sensitive coating with the aid of a camera arrangement which includes, inter alia, a light emitting substance, and developing the printing pattern by fixating and drying the coating surrounding the printing pattern and sealing the meshes of the cloth.

The object of the present invention is to provide a method which will enable a plurality of printing forms each having mutually different printing patterns to be produced automatically and in sequence, preferably in accordance with the so-called "direct stencil method".

BACKGROUND PRIOR ART

The differences between the production of printing forms in accordance with the "indirect stencil method" and in accordance with the "direct stencil method" are explained in U.S. Pat. No. 4,214,522, which also describes and illustrates an arrangement for producing or treating printing form (stencils) intended for use in silk screen printers.

This method is based on the application of a light sensitive coating to a cloth stretched in a supporting frame, and processing the coating with light so as to effect an image transfer corresponding to the desired printing pattern.

The cloth is intended to be treated with liquid, i.e., water, such as either to clean the cloth or develop the pattern. To this end the arrangement includes at least two pipes which have mutually opposing nozzles and which are intended to co-operate with a holder in a manner such that one of said two pipes will pass over the rear side of the cloth while the other pipe will pass over the other side of the cloth with the nozzles facing one another.

For the purpose of producing printing forms in accordance with the "direct stencil method" it is known to produce such forms manually and in sequence by providing a cloth stretched in a printing frame with a light-sensitive coating, permitting the coating to dry, exposing an image corresponding to the desired printing pattern on the light-sensitive coating, with the aid of a camera arrangement including, inter alia, a light emitting means, developing the printing pattern and fixating and drying the coating surrounding said pattern.

Considering that large posters, placards or the like are composed from a multiple of mutually adjacent part images, e.g. 8 images, which form the total image, and considering that four different printing forms are required for each part image in a four-colour printing process, one for each colour, the number of printing forms required to produce a single poster will be quite considerable.

Since large posters are normally produced in limited numbers, an obvious requirement is to achieve a high rate of manufacture of the printing forms, in order to keep down the total manufacturing costs.

Consequently, in the case of printers of average size it is not unusual to fully employ several workmen with the task of producing the requisite printing forms, and even with the task of touching-up the printing pattern on the cloth in order to rectify defects caused by the influence of undesirable dust particles on the printing form pattern.

SUMMARY OF THE INVENTION

TECHNICAL PROBLEMS

When considering the present state of the art it will be seen that a qualified technical problem resides in the provision of conditions which will enable such printing forms to be produced automatically, preferably in accordance with the "direct stencil method", so that a given number of printing forms can be produced per unit of time with the aid of a smaller work force.

A further technical problem is one of enabling such printing forms to be produced automatically under cleaner conditions and less dusty environments than those prevailing when producing such forms manually.

Another technical problem is one of providing an arrangement for automatically producing printing forms, in which each of the various production steps can be carried out within an individual, restricted space within which temperature and moisture can be controlled individually and held constant.

A further technical problem is one of creating conditions, with the aid of simple means in an arrangement for automatically producing printing forms such that the quality of the printing forms produced will be more uniform than those produced manually.

Another technical problem is one of realizing that such printing forms can be produced automatically by projecting an image corresponding to the desired pattern directly onto a cloth coated with a light-sensitive substance.

Another technical problem is one of enabling a cloth which is provided with a light-sensitive coating and stretched in a printing frame to be fed from a first magazine directly to a registered position in front of a camera, which by direct-projection of an image exposes the desired pattern, and thereafter feeding the frame carrying the exposed light-sensitive coating to a unit in which the exposed coating is developed, fixated and dried, so as to produce a printing form which can be used in a silk screen printer for printing ink or varnish onto print material.

SOLUTION

The present invention relates to an arrangement for producing a multiple of printing forms automatically and in sequence, particularly printing forms of the kind intended for use in silk screen printing processes carried out by a silk screen printer in which each printing form is produced by providing a cloth stretched in a flexurally rigid frame with a light-sensitive coating, drying the coating, exposing the light-sensitive coating to an image corresponding to the desired printing pattern with the aid of a camera arrangement which includes, inter alia, a light emitting substance, developing the printing pattern and fixating and drying the coating surrounding the printing pattern.

For the purpose of enabling such manufacture to be effected automatically, it is proposed in accordance with the present invention that a first magazine which is capable of accommodating a multiple of printing frames each having stretched therein a cloth on which a light-sensitive coating has been applied is arranged adjacent a camera arrangement, that a first conveyor means is provided for moving a printing frame from the first magazine to a given position in front of the camera, that the printing frame is held firmly in a given position while exposing the image, and that a second conveyor means is provided for moving a printing frame with its exposed coating from the position in front of the camera to a position on one side of the camera arrangement, where, inter alia, the printing pattern is developed.

According to the invention, and as exemplified by the illustrative embodiment, the first conveyor means and the second conveyor means may comprise an integrated unit, such that a printing frame with an exposed image is moved from the given position in front of the camera at the same time as a printing frame is moved from the magazine.

The exemplifying embodiment also shows that the camera arrangement shall be adapted for projecting an image corresponding to a printing pattern intended for coloured printing paste directly onto the coating.

A second magazine is provided for accommodating a plurality of printing frames each provided with a stretched cloth but lacking a light-sensitive coating.

According to a further embodiment of the invention means are provided for controlling the quality of the printing frames fed to the second magazine and stored therein, wherein a printing frame of unacceptable quality is replaced with a new printing frame and clot-n of high quality.

It is also proposed that a number of printing forms previously used in a silk screen printing process are fed to a printing-form washing unit and from there to a quality control unit and then to a second magazine, and from there to a unit in which a light-sensitive coating is applied to the cloth stretched in the frame, and from that unit to a coating drying unit and from there to the first magazine.

In accordance with a further embodiment of the invention at least the first magazine, the unit in which the light-sensitive coating is applied and the unit in which the coating is dried will comprise light-impermeable wall, floor and ceiling portions provided with slots through which the printing frames concerned can be removed. As will be understood, these portions may comprise a material which is permeable to light having a wavelength which will not influence the light-sensitive coating.

ADVANTAGES

Those advantages associated with an arrangement according to the present invention reside in the ability to produce a large number of printing forms per unit of time with the aid of a very limited number of workmen, normally only one person, combined with the fact that the forms can be produced in a practically dust-free environment, thereby enabling printing forms of high quality to be produced, which require little or no renovation or touching-up.

BRIEF DESCRIPTION OF THE DRAWING

An embodiment of an arrangement at present preferred for producing automatically and in sequence a multiple of printing forms intended for use in a silk screen printer will now be described in more detail with reference to the accompanying drawing, in which.

DESCRIPTION OF PREFERRED EMBODIMENTS

Figure 1:
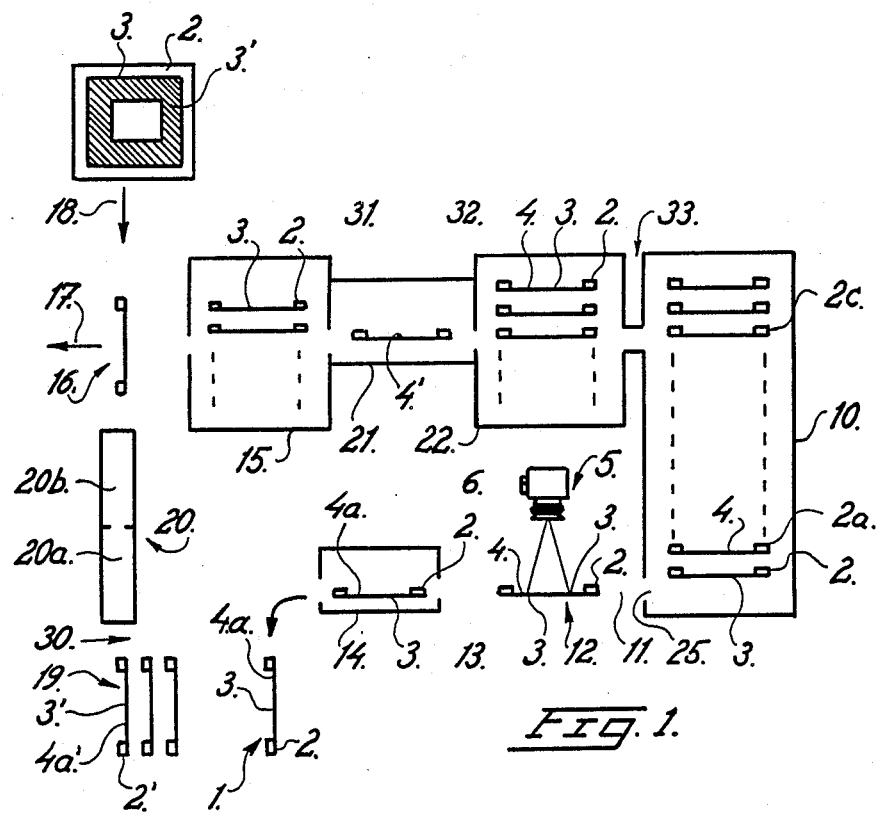
FIG. 1 illustrates schematically and in horizontal view the principle construction of the arrangement.

FIG. 1 illustrates highly schematically an inventive arrangement for producing a multiple of printing forms 1 automatically and in sequence. These printing forms are intended for use in a silk screen printing method carried out in a silk screen printer.

Since neither the printing method nor the printer have any significant bearing on the present invention, and since the method and printer are known to the art in several forms they will not be described in detail here.

It should be mentioned, that such printing forms comprise a flexurally rigid printing frame in which there is stretched, a cloth which is coated with a light-sensitive substance, the cloth being exposed and developed. The cloth is treated in a manner to form passages in a configuration which corresponds to the desired printing pattern and through which printing paste is pressed by a squeegee during the printing process.

These printing forms are held in sequence in holders formed in the printer. One printing form is required for each printing colour or varnish.

Each completed printing form 1 is constructed from a flexurally rigid printing frame 2 in which there is stretched a cloth 3. The cloth 3 is coated totally with a light-sensitive coating 4 which seals the meshes of the cloth.

The light-sensitive 4 is first allowed to dry and then irradiated with an image 6 corresponding to the desired printing pattern for the printing colour or ink intended, with the aid of a camera arrangement 5 which includes, inter alia, a light emitting means. Subsequent to this exposure the printing pattern is developed and fixated whereafter the coating 4a surrounding the printing pattern is allowed to dry and therewith seal the meshes.

In order to enable these printing forms, one for each printing colour, to be produced automatically, the inventive arrangement includes a first magazine 10 which is constructed to accommodate a multiple of printing frames 2, 2a ... 2c in side by-side relationship, each of the frames having stretched therein a cloth 3 on which a light-sensitive coating 4 has previously been applied without applying the pattern. This first magazine is thus located adjacent the camera arrangement 5.

An advantage is afforded when each of the printing frames 2,2a ... 2c can be transported quickly from the dark first magazine 10 to the camera arrangement 5, not only because of the light sensitive layer but primarily in order to increase the production rate.

Each of the printing frames 2 positioned in the first magazine 10 is moved by means of a first conveyor means, 11 from the first magazine 10 to a given registered position 12 in front of the camera 5.

An image corresponding to the desired printing pattern is transferred to the cloth by direct projection in this registered position, i.e., image corresponding to a single part image and a printing colour for the image.

For the sake of clarity, the conveyor means 11 and 13 have not been drawn in detail.

The conveyor means may have any one of a number of different forms, such as chain conveyors, belt conveyors and the like capable of being stopped in predetermined positions.

The printing frame is held stationary in the given position 12 by the conveyor means used, during the whole of the time in which the image 6 is exposed to the coating 4.

A second conveyor means 13 is provided for moving the printing frame 2, with the exposed coating, from its position 12 in front of the camera to a position on the left-hand side of the camera 5, this position being referenced 14, where the printing pattern is developed in a manner known per se.

Since conveyor means of the kind in question are known to the art, the conveyor means 11 and 13 will not be described in detail, although it is proposed in accordance with the invention that the first conveyor means 11 and the second conveyor means 13 comprise an integrated unit.

In this it is proposed that the conveyor means are constructed so that a printing frame 2 is moved from the magazine 10 to the camera arrangement 5 at the same time as an exposed printing frame in the position 12 in front of the camera is moved to the position 14.

Exposure of the light-sensitive coating on the subsequent printing frame carrying an unexposed cloth requires a change of images in the camera. This image change can be effected at the same time as the aforesaid printing frames are moved from their respective positions. The guide devices and arrangements by means of which this change is effected have not been shown, for the sake of clarity.

The camera arrangement 5 is thus adapted for direct-projection of an image 6 onto the coating 4, this image being inserted into the camera 5 in a known manner.

For the purpose of enabling completed printing forms to be produced automatically it is proposed in accordance with the invention that the arrangement includes a second magazine 15 for receiving printing frames 2 which are provided with a stretched cloth 3 but which lack a light-sensitive coating.

These printing frames 2 with cloth 3 shall be controlled or checked and accepted for continued, subsequent automatic treatment.

The printing frames 2 fed to the second magazine 15 and accommodated therein are taken from a quality control unit 16, in which printing frames of unacceptable quality are rejected and replaced with a new, high quality printing frame and cloth. The arrow 17 indicates the removal of unacceptable printing frames from the production process, and the arrow 18 indicates the introduction of a new printing frame 2 with stretched cloth 3 into the system.

The quality controlling unit 16 may consist of an ocular control carried out by an operator.

In order to reduce the consumption of light-sensitive coating substance, the cloth 3, at its outer edge portions (or at locations where no pattern is required) may be coated by a substance 3' different from the light-sensitive substance. These portions have been hatched in FIG. 1 for illustrative purposes.

In order to obtain a system in which used printing forms can be re-used for other printing patterns, printing forms 2' used in a silk screen process are transferred from a printing station 40 to a third magazine 19, from where they are moved to a printing-form washing unit 20 and from there to the quality control unit 16. The printing forms are then moved from the unit 16 to the second magazine 15 and from there to a unit 21 in which a light-sensitive coating is applied to the cloths of respective forms, and from there to a unit 22 in which the light-sensitive coating is dried. The treated printing forms are then taken from the unit 22 and passed to the first magazine 10.

In this case, a conveying means 30 passes each used printing form 2' to the washing unit 20 in which printing paste is removed from the printing form 2' in a first step 20a and the developed and fixated coating 4a' around the printing pattern in question is removed from the cloth 3' in a second step 20b.

The conveyor 30 may be of any known kind and will not therefore be described in detail.

Printing frames 2 with their respective cloths 3 which have been checked and found acceptable can now be stored in the second magazine 15.

Printing frames 2 can then be transferred individually, by means of a conveyor 31 (not shown in detail), to the unit 21 affording application of a light-sensitive coating, and the printing frames orientated in suitable positions (horizontal positions) for coating the cloth 3 with a light-sensitive wet coating 4'. This process of coating the cloth with the requisite substance is known per se and will not therefore be described in detail.

Each printing frame 2 with its coated cloth 3 is then passed to a coating drying unit 22, by means of a further conveyor 32, not shown in detail, in which the printing frames 2 are orientated, preferably horizontally, for drying the coating 4. The printing frames 2 are then conveyed to the first magazine 10 by a conveyor 33, and positioned vertically in the magazine.

It is proposed that the printing forms and cloths are processed in the units 21, 22 and 10 in a dark environment and that the printing frames are transported between the units in a dark environment, to the extent that such is possible.

Since the coating is sensitive solely to light of high intensity and of given wavelengths, the requirement of a dark environment is not unduly critical.

Figure 2:
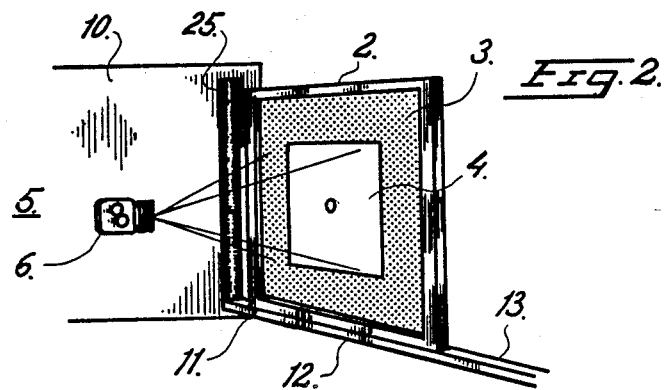
FIG. 2 illustrates in perspective the manner in which printing frames provided with a stretched cloth and carrying a non-exposed light-sensitive coating are fed from a first magazine to a position in which the light-sensitive coating can be exposed with the aid of a camera arrangement.

As illustrated in FIG. 2, the first magazine 10 comprises light impermeable wall, and floor and ceiling portions having a slot 25 through which one printing frame at a time can be removed from the magazine.

As will be understood, the same principle can be employed at other, similar locations in the arrangement, such as between the units 21 and 22 and the magazine 10.

Indicated in the illustrative embodiment of the invention are separate units 21, 22, 10 and 14 by means of which locally acting temperatures and humidities can be readily controlled and adapted to pre-determined requirements for respective units. This enables printing forms of uniform quality to be produced in combination with a dust free environment, so as to reduce the amount of touch-up work otherwise required.

It will be understood that the afore-described embodiments do not limit the invention and that modifications can be carried out within the scope of the invention as defined in the following claims.

I claim:

1. A method of producing printing forms in sequence comprising the steps of:

arranging in a magazine a plurality of printing frames, each including a stretched cloth and a light-sensitive coating, said printing frames being arranged in parallel relationship and parallel to an outlet slit of said magazine, advancing said parallel printing frames within said magazine toward said outlet slit in a first direction, sequentially passing said printing frames through said outlet slit in a second direction substantially perpendicular to said first direction, said printing frames passing through said slit while remaining parallel to printing frames disposed in said magazine, terminating movement of each printing frame traveling in said second direction when such printing frame occupies a position in front of an imaging means, actuating said imaging means to expose the light-sensitive coating to an image corresponding to a desired printing pattern, initiating movement of said printing frame with the exposed light-sensitive coating to move said last-named printing frame out of said exposing station and into a developing station, and developing the printing pattern at said developing station.

2. A method according to claim 1, wherein said printing frames are moved out of said exposing station and into said developing station in said second direction.

3. A method according to claim 2, wherein said imaging means, upon actuation, projects the image in a third direction parallel to said first direction.

4. A method according to claim 3, wherein said printing frames are passed through said slit at the same time that a printing frame with an exposed light-sensitive coating is moved out of said exposing station.

5. A method according to claim 4, wherein prior to said arranging step said printing frames are advanced through an additional magazine in a fourth direction transversely of said first direction while being coated with said light-sensitive coating and while said coating is being dried, and the thus-coated printing frames are passed into said first-named magazine from said additional magazine.

6. A method according to claim 5, wherein said printing frames are passed into said first-named magazine through an opening in said first-named magazine located on a side of said first-named magazine in which said slit is located, said fourth direction being parallel to said second direction.

7. A method according to claim 6, wherein said coated printing frames are passed through said magazines while said magazines are impermeable to light which is harmful to said coating.

* * * * *